US006838747B2

United States Patent
Oda (12) United States Patent
(10) Patent No.: US 6,838,747 B2
(45) Date of Patent: Jan. 4, 2005

(54) SEMICONDUCTOR DEVICE HAVING RESISTIVE ELEMENT FORMED OF SEMICONDUCTOR FILM

(75) Inventor: Hidekazu Oda, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/192,706

(22) Filed: Jul. 11, 2002

(65) Prior Publication Data

US 2003/0025162 A1 Feb. 6, 2003

(30) Foreign Application Priority Data

Jul. 31, 2001 (JP) ........................................ 2001-231186

(51) Int. Cl.⁷ .............................................. H01L 29/00
(52) U.S. Cl. .................... 257/536; 257/538; 257/349; 257/401; 257/363; 257/364
(58) Field of Search ................................ 257/538, 349, 257/401, 363, 364, 536

(56) References Cited

U.S. PATENT DOCUMENTS

| 4,597,163 | A | * | 7/1986 | Tsang ........................ 29/576 B |
| H546 | H | * | 11/1988 | Schnable et al. ............... 419/7 |
| 5,101,258 | A | | 3/1992 | Moriuchi et al. |
| 5,254,870 | A | | 10/1993 | Kimura |
| 5,341,022 | A | | 8/1994 | Kuroi et al. |
| 5,389,563 | A | | 2/1995 | Kuroi et al. |
| 2001/0030349 | A1 | * | 10/2001 | Lin et al. ..................... 257/401 |
| 2002/0008302 | A1 | * | 1/2002 | Singh et al. .................. 257/538 |

FOREIGN PATENT DOCUMENTS

| KR | 1990-13636 | 9/1990 |
| KR | 1990-702571 | 12/1990 |

OTHER PUBLICATIONS

S. M. Sze, "Physics of Semiconductor Devices," John Wiley & Sons, New York, (1981), p. 21.*

* cited by examiner

*Primary Examiner*—Eddie Lee
*Assistant Examiner*—Thomas Magee
(74) *Attorney, Agent, or Firm*—Oblon, Spivak, McClelland, Maier & Neustadt, P.C.

(57) ABSTRACT

A dopant is ion-implanted into a second region (52) of a polycrystalline silicon film (50) for a resistive element (5). Nitrogen or the like is ion-implanted into a second region (62) of a polycrystalline silicon film (60) for a resistive element (6). The density of crystal defects in the second regions (52, 62) is higher than that in first regions (51, 61). The density of crystal defects in a polycrystalline silicon film (70) for a resistive element (7) is higher near a silicide film (73). A polycrystalline silicon film (80) for a resistive element (8) is in contact with a substrate (2) with a silicide film in an opening of an isolation insulating film (3). The density of crystal defects in a substrate surface (2S) near the silicide film is higher than that in the vicinity. With such a structure, a current leak in an isolation region can be reduced.

11 Claims, 9 Drawing Sheets

SEMICONDUCTOR DEVICE HAVING RESISTIVE ELEMENT FORMED OF SEMICONDUCTOR FILM

BACKGROUND OF THE INVENTION

1. Field of the Invention

The present invention relates to a semiconductor device capable of reducing a current leak in an isolation region and a method of manufacturing the same.

2. Description of the Background Art

In a semiconductor device, basic elements such as transistors, capacitors and resistors are connected with wires. Further, electrodes of the transistors are sometimes used themselves as wires. As the electrodes of the transistors and capacitors and the wires, in general, metals such as aluminum and copper and polycrystalline silicon are largely used. In this case, when a polycrystalline silicon film is used as an electrode or a wire, forming a silicide film or a metal film entirely on the polycrystalline silicon film allows reduction in electrical resistance.

A semiconductor film, such as a polycrystalline silicon film, can be used as a resistive element. In this case, the resistance value of the resistive element is in inverse proportion to the cross-sectional area of the polycrystalline silicon film and in proportion to the length and the impurity (dopant) concentration thereof. For example, in order to increase the resistance, the cross-sectional area of the polycrystalline silicon film is made smaller or the length thereof is made longer. Further, reducing the impurity concentration of the polycrystalline silicon film or using the polycrystalline silicon film with no impurity implanted therein increases the resistance.

A polycrystalline silicon film of low resistance to be used as an electrode or a wire and a polycrystalline silicon film of high resistance to be used as a resistive element can be formed of one polycrystalline silicon film. Hereafter, discussion will be made on a method of manufacturing a semiconductor device 1P in the background art, referring to FIG. 14.

Figure 14:
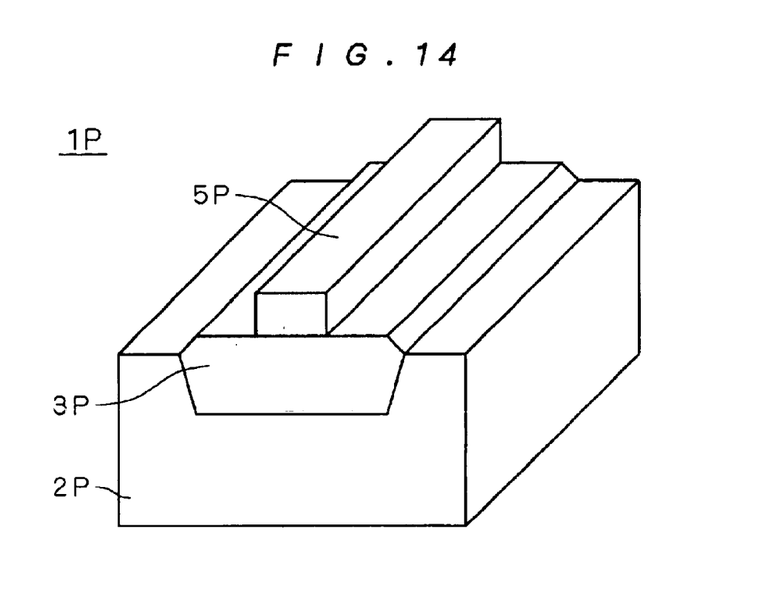
FIG. 14 is a perspective view illustrating a semiconductor device in the background art.

First, an isolation insulating film 3P made of a silicon oxide film is formed by LOCOS (Local Oxidation of Silicon) and the like, to section a silicon substrate 2P into an active region and an isolation region. After that, wells and isolation implantation regions are made by ion-implantation and the like.

Next, a gate oxide film is formed in a transistor formation region (now shown). After that, a not-doped (intrinsic) polycrystalline silicon film is deposited by LPCVD (Low Pressure Chemical Vapor Deposition) entirely on the silicon substrate 2P to have a thickness of 50 nm to 250 nm and patterned by photolithography. In this case, a portion of the polycrystalline silicon film which is patterned on the isolation insulating film 3P serves as a resistive element 5P. The resistive element 5P is covered with a resist, an oxide film or the like for protection from any effect in a transistor manufacturing process.

A portion of the patterned polycrystalline silicon film in a transistor arrangement region serves as a gate electrode of a transistor together with a silicide film. Specifically, a metal film such as titanium, cobalt, nickel or tungsten is so formed as to come into contact with the polycrystalline silicon film on an exposed surface thereof and silicified to form a silicide film. Alternatively, a tungsten silicide film or the like is so directly deposited as to come into contact with the polycrystalline silicon film. Further, in this case, the metal film and the silicide film used for forming a gate silicide film are also formed on the resist or the like which covers the resistive element 5P.

After that, forming a protection film, metal wires and the like completes the semiconductor device 1P.

Further, there may be a case where an amorphous silicon is used instead of the polycrystalline silicon.

As discussed above, while the transistor arrangement region undergoes the above processings, the resistive element 5P is covered with the resist or the oxide film. Further, in the processings performed on the transistor arrangement region, the metal film and the silicide film used for forming the gate silicide film are formed on the resist or the like.

Figure 15:
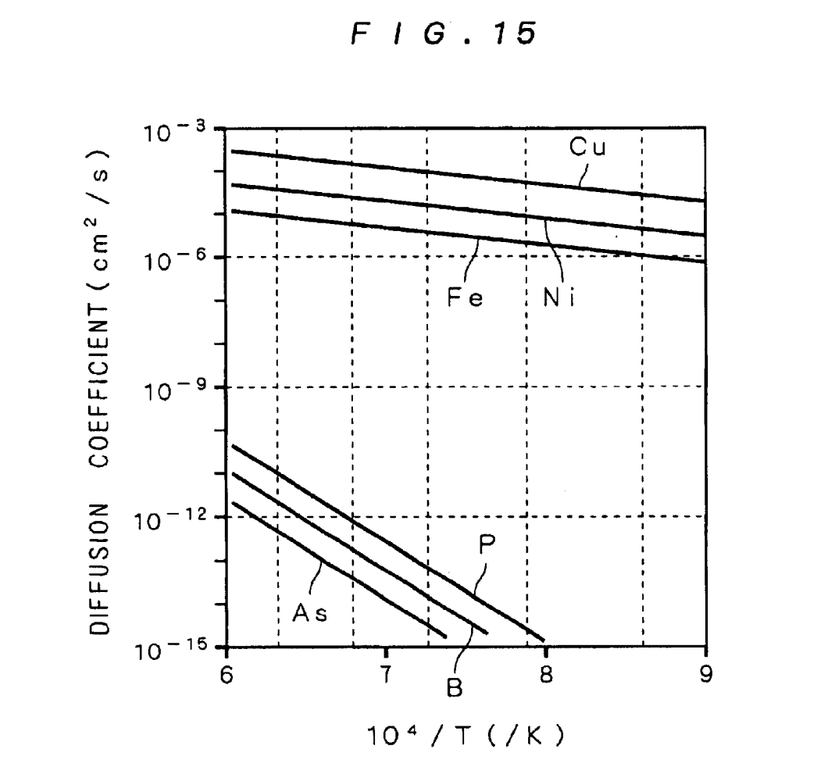
FIG. 15 is a graph illustrating diffusion coefficient in silicon.

The diffusion coefficient of metal atoms in the resist or the oxide film has the same tendency as that in silicon (see FIG. 15), being larger than those of boron, arsenic and the like. For this reason, the metal atoms in the metal film and the silicide film used for the gate silicide film sometimes enter the resist or the like.

Figure 16:
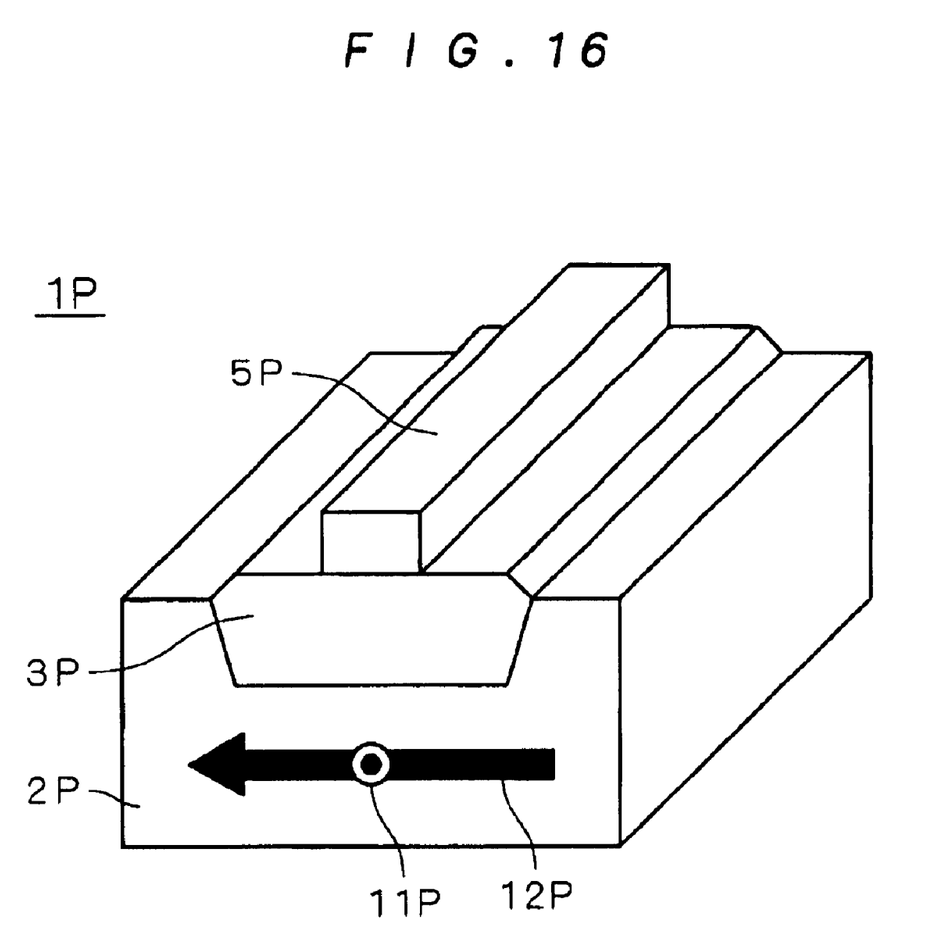
FIG. 16 is a perspective view illustrating a current leak in the background-art semiconductor device.

The metal atoms entering the resist or the like go through the polycrystalline silicon film 5P or/and the isolation insulating film 3P, to be diffused in the silicon substrate 2P. Consequently, as shown in FIG. 16, metal atoms 11P entering the silicon substrate 2P cause a leak current 12P below the isolation insulating film 3P, in other words, in the isolation region.

Further, metal atoms in the metal film serving as a metal gate (e.g., tungsten or aluminum) and the metal wire (e.g., aluminum or copper) can also serve as the metal atoms 11P.

SUMMARY OF THE INVENTION

It is an object of the present invention to provide a semiconductor device capable of reducing a current leak in an isolation region.

According to a first aspect of the present invention, the semiconductor device includes a semiconductor substrate, an insulating film, and a resistive element formed of a semiconductor film. The semiconductor substrate has a substrate surface, the insulating film is arranged on the substrate surface. The resistive element is opposed to the substrate surface with the insulating film interposed therebetween and arranged in contact with the insulating film. In a plan view, the semiconductor film includes a first region and a second region whose density of crystal defects is higher than that of the first region.

Since the crystal defects in the second region produce a gettering effect, a leak current below the insulating film can be reduced.

According to a second aspect of the present invention, the semiconductor device includes a semiconductor substrate, an insulating film, a compound film made of a compound of the material of the semiconductor substrate and a metal, and a resistive element formed of a semiconductor film. The semiconductor substrate has a substrate surface. The insulating film has an opening and is arranged on the substrate surface. The compound film is arranged in contact with the substrate surface in the opening. The resistive element is opposed to the substrate surface with the insulating film interposed therebetween and arranged in contact with the compound film.

Formation of the compound film by alloying the semiconductor substrate and the metal causes crystal defects near the compound film in the semiconductor substrate. Since the crystal defects produce a gettering effect, a leak current below the insulating film can be reduced. Further, the compound film serves as a barrier metal, protecting the semiconductor substrate against the ingress of (material of) the semiconductor film.

These and other objects, features, aspects and advantages of the present invention will become more apparent from the following detailed description of the present invention when taken in conjunction with the accompanying drawings.

DESCRIPTION OF THE PREFERRED EMBODIMENTS

<The First Preferred Embodiment>

Figure 1:
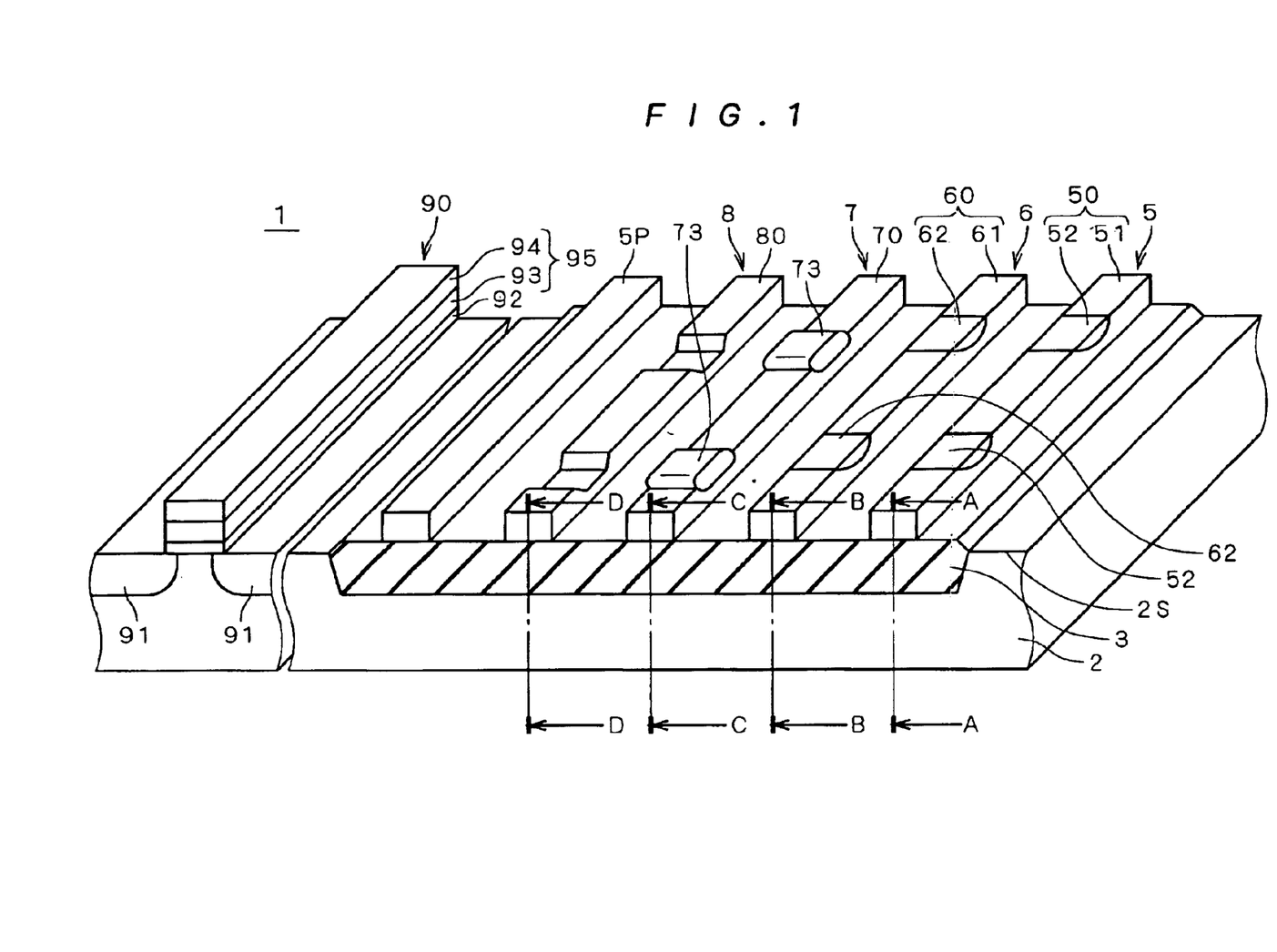
FIG. 1 is a perspective view illustrating a semiconductor device in accordance with a first preferred embodiment of the present invention.

FIG. 1 is a perspective view illustrating a semiconductor device in accordance with the first preferred embodiment of the present invention. As shown in FIG. 1, a semiconductor device 1 comprises a semiconductor substrate (also referred to simply as "substrate") 2, a MOSFET 90, an isolation insulating film (or insulating film) 3 and resistive elements 5, 6, 7, 8 and 5P. Further, not shown in FIG. 1, the semiconductor device 1 also comprises other transistors, capacitors and the like.

Specifically, the semiconductor substrate 2 is made of e.g., p-type silicon. On a surface (hereinafter referred to as "substrate surface") 2S of the substrate 2, the isolation insulating film 3 is formed, by which the substrate 2 is sectioned into an active region and an isolation region. Further, an isolation implantation region is formed in the substrate surface 2S below the isolation insulating film 3.

In the active region, a gate insulating film 92, a polycrystalline silicon film 93 and a silicide film 94 of the MOSFET 90 are formed on the substrate surface 2S in this order. Further, the polycrystalline silicon film 93 and the silicide film 94 constitute a gate electrode 95 of the MOSFET 90. Source/drain regions 91 of the MOSFET 90 are formed with a portion of the substrate 2 below the gate insulating film 92, in other words, a channel region interposed therebetween.

Next, discussion will be made on the resistive elements 5 to 8 and 5P. The resistive elements 5 to 8 and 5P are connected to the gate electrode 95 and the source/drain regions 91 of the MOSFET 90 with not-shown portions or connected to the not-shown transistors, capacitors or the like. Further, the resistive element 5P is the same one as that in the background art.

Figure 2:
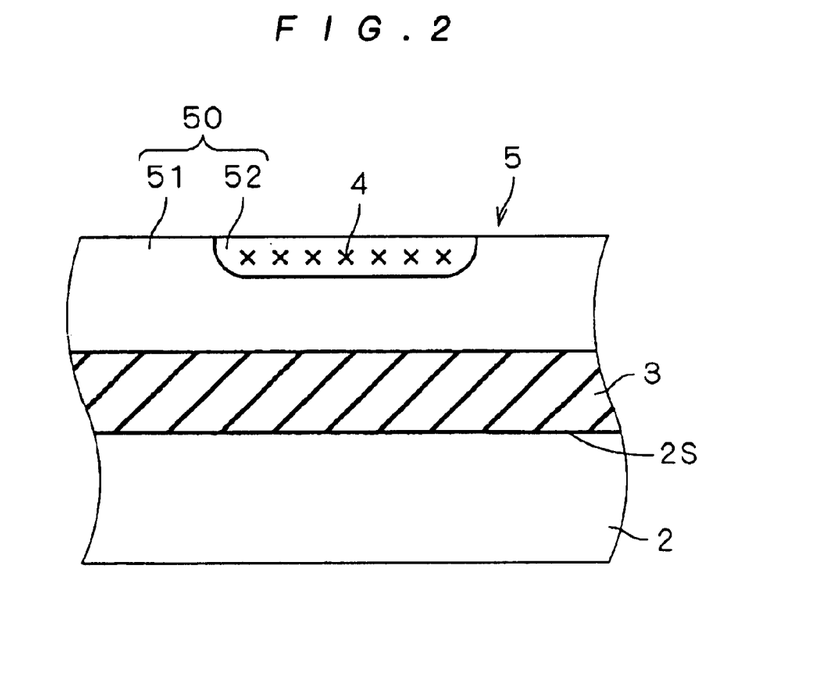
FIGS. 2 to 5 are cross sections illustrating the semiconductor device in accordance with the first preferred embodiment of the present invention.

FIG. 2 is a cross section illustrating the resistive element 5. FIG. 2 is a partial vertical section taken along the line A—A of FIG. 1. The resistive element 5 is made of a polycrystalline silicon film (or semiconductor film) 50 formed on the isolation insulating film 3 (more specifically, opposed to the substrate surface 2S with the isolation insulating film 3 interposed therebetween, being in contact with the isolation insulating film 3). The polycrystalline silicon film 50 has a strip-like shape with a thickness of e.g., 50 nm to 250 nm.

Especially, the polycrystalline silicon film 50 of the resistive element 5 includes a first region 51 and a second region 52 whose impurity (dopant) concentration is higher than that of the first region 51 in a plan view corresponding to the plane of the substrate surface 2S. The second region 52 includes arsenic having concentration of $5\times10^{20}/cm^3$. Further, the dopant in the second region 52 may give P-type conductivity type or N-type conductivity type. Impurities in the second region 52 serve as crystal defect inducing particles to induce crystal defects 4 and the density of crystal defects 4 in the second region 52 is higher than that in the first region 51 in accordance with the impurity concentrations in the respective regions.

The polycrystalline silicon film 50 includes at least one second region 52 (FIG. 1 shows the case of two second regions 52), and the second region 52 is formed in e.g., one of surfaces of the polycrystalline silicon film 50 away from the isolation insulating film 3. Further, unlike the case shown in FIGS. 1 and 2, the second region 52 may be so formed as to come into contact with the isolation insulating film 3, in other words, formed entirely in the direction of thickness or may formed partially in the direction of width of strip-shape (not entirely in the direction of width).

Figure 3:
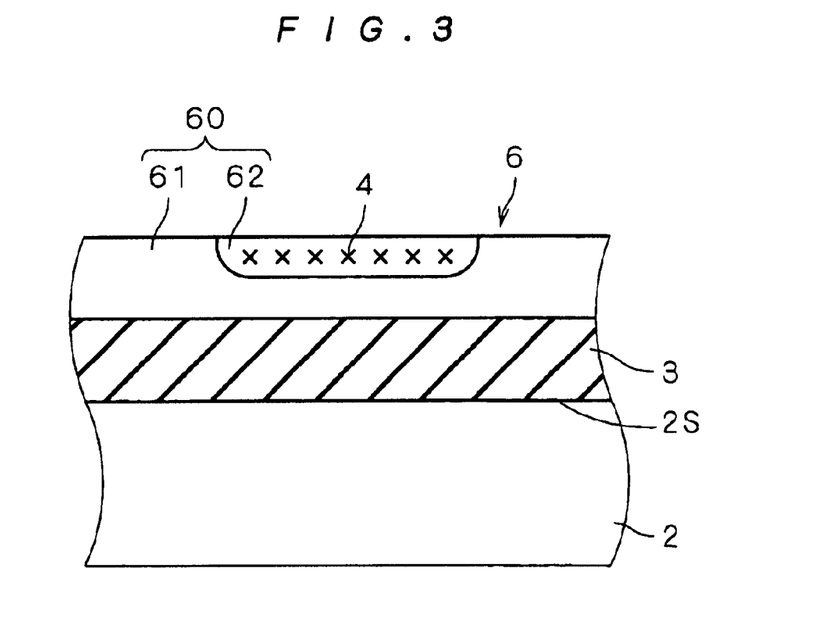

Next, FIG. 3 is a cross section illustrating the resistive element 6. FIG. 3 is a partial vertical section taken along the line B—B of FIG. 1. The resistive element 6 is made of a polycrystalline silicon film 60, like the resistive element 5 made of the polycrystalline silicon film 50, and the polycrystalline silicon film 60 of the resistive element 6 includes a first region 61 and at least one second region 62, like the polycrystalline silicon film 50.

Especially, the second region 62 of the resistive element 6 includes at least one kind of particles (element) less affecting the conductivity type of the polycrystalline silicon film 60, out of e.g., nitrogen, fluorine, argon and silicon (or elemental semiconductor), instead of the dopant in the second region 52, and the density of crystal defects 4 in the second region 62 is higher than that in the first region 61. Further, the concentration of nitrogen or the like in the second region 62 is e.g., $1\times10^{15}$ to $3\times10^{15}/cm^3$.

Figure 4:
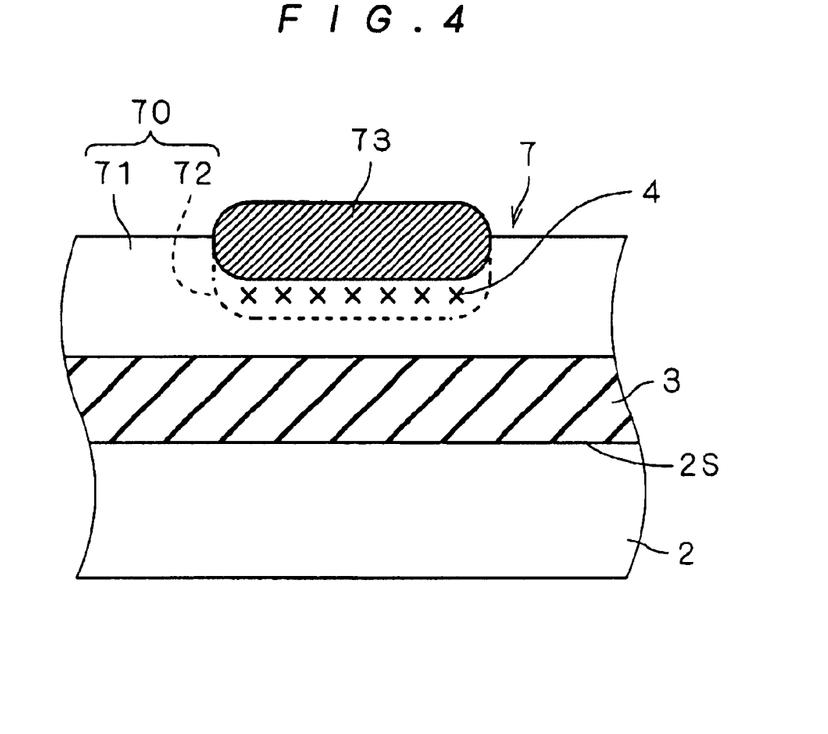

Next, FIG. 4 is a cross section illustrating a structure near the resistive element 7. FIG. 4 is a partial vertical section taken along the line C—C of FIG. 1. The resistive element 7 is made of a polycrystalline silicon film 70, like the resistive element 5 made of the polycrystalline silicon film 50, and the polycrystalline silicon film 70 of the resistive element 7 includes a first region 71 and at least one second region 72, like the polycrystalline silicon film 50. The density of crystal defects 4 in the second region 72 is higher than that in the first region 71.

With respect to the resistive element 7, the semiconductor device 1 further comprises a silicide film 73 made of e.g., titanium silicide, cobalt silicide, nickel silicide or tungsten silicide. The silicide film 73 is opposed to the isolation insulating film 3 with the polycrystalline silicon film 70 interposed therebetween and so arranged as to come into contact with the second region 72 of the polycrystalline silicon film 70. In other words, the second region 72 of the resistive element 7 is provided between the silicide film 73 and the isolation insulating film 3.

Figure 5:
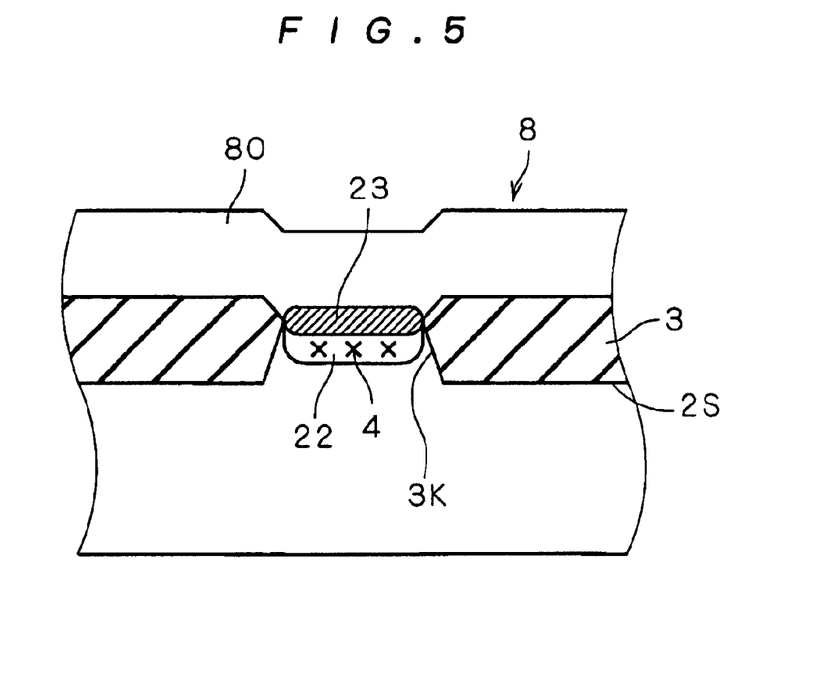
Figure 6:
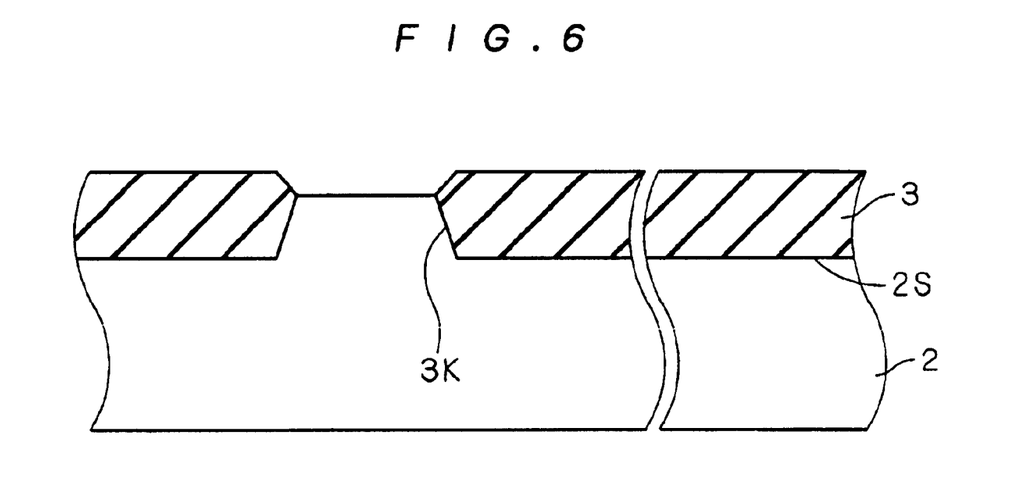
FIGS. 6 to 13 are cross sections illustrating a method of manufacturing a semiconductor device in accordance with the first preferred embodiment of the present invention.

Next, FIG. 5 is a cross section illustrating a structure near the resistive element 8. FIG. 5 is a partial vertical section taken along the line D—D of FIG. 1. In the semiconductor device 1, at least one opening 3K is formed in the isolation insulating film 3 and the opening 3K penetrates the isolation insulating film 3 in the direction of thickness. An n-type impurity region 22 (whose conductivity type is opposite to that of the p-type substrate 2) is formed in the substrate surface 2S positioned inside the opening 3K (in the plan view of the substrate surface 2S).

With respect to the resistive element 8, the semiconductor device 1 further comprises a silicide film (or compound film) 23 in contact with the impurity region 22, in other words, in contact with the substrate surface 2S in the opening 3K. Further, the above silicide materials may be used for the silicide film 23, like the silicide film 73.

Especially, the impurity region 22, more specifically, a region near the silicide film 23 in the substrate surface 2S inside the opening 3K has higher density of crystal defects 4 than its vicinity, which corresponds to the second region 72 of the resistive element 7.

Moreover, a polycrystalline silicon film (or semiconductor film) 80 forming the resistive element 8 is so formed as to come into contact with the silicide film 23 and the isolation insulating film 3. Further, a portion of the polycrystalline silicon film 80 which is in contact with the isolation insulating film 3 is opposed to the substrate surface 2S with the isolation insulating film interposed therebetween. Like the above-discussed polycrystalline silicon film 50, the polycrystalline silicon film 80 has a strip-like shape with a thickness of e.g., 50 nm to 250 nm.

In this case, the resistive element 8 and the silicon substrate 2 can be electrically isolated from each other by the impurity region 22. Further, the silicide film 23 serves as a barrier metal, protecting the substrate 2 against the ingress of (silicon atoms of) the polycrystalline silicon film 80.

For one resistive element 8, in other words, one polycrystalline silicon film 80, at least one structure including the opening 3K of the isolation insulating film 3, the silicide film 23 and the impurity region 22. Further, unlike the case shown in FIGS. 1 and 5, the strip-like polycrystalline silicon film 80 may be formed so that its width can be larger than the opening 3K of the isolation insulating film 3.

Resistance values of the resistive elements 5, 6, 7 and 8 can be controlled and set, depending on the impurity concentration, the cross-sectional area, the length and the like of the polycrystalline silicon films 50, 60, 70 and 80.

Next, a method of manufacturing the semiconductor device 1 will be discussed, referring the cross sections of FIGS. 6 to 13 besides the views of FIGS. 1 to 5.

First, the silicon substrate 2 is prepared and the isolation insulating film 3 is so formed as to come into contact with the substrate surface 2S by e.g., LOCOS (Local Oxidation of Silicon) and the like. At this time, the isolation insulating film 3 is formed with the opening 3K for the resistive element 8 provided therein (see FIG. 6). Further, the isolation insulating film 3 may be formed by trench isolation method, and in this case, the isolation insulating film 3 fills a trench formed in the substrate 2 (accordingly, is formed on the substrate surface 2S). After forming the isolation insulating film 3, wells and isolation implantation regions are formed by ion-implantation and the like.

Figure 7:
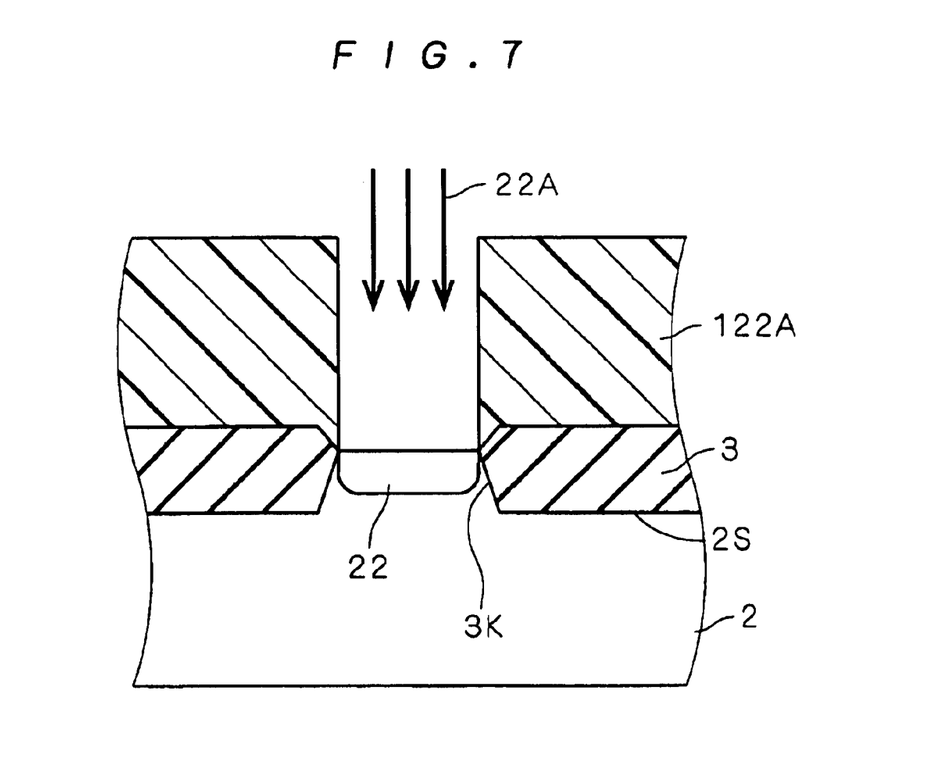

After that, as shown in FIG. 7, a resist 122A is formed on the isolation insulating film 3 with the opening 3K provided therein. Then, with the resist 122A used as a mask, e.g., arsenic 22A is ion-implanted to form the impurity region 22 in the substrate surface 2S inside the opening 3K. The resist 122A is thereafter removed. Further, the ion implantation for forming the impurity region 22 may be performed in e.g., a channel-dope process.

Figure 8:
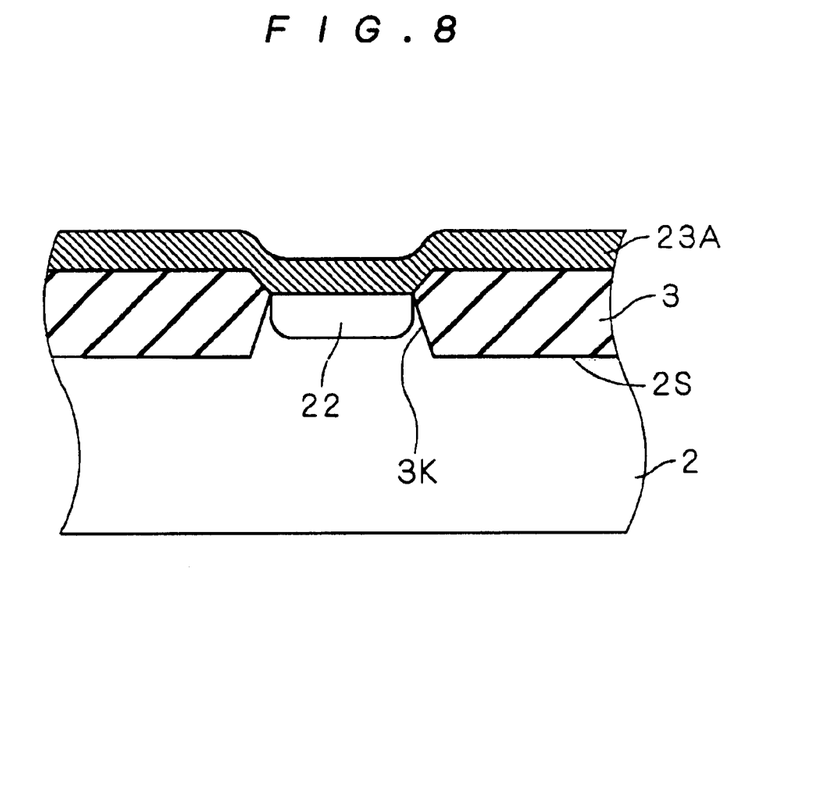
Figure 9:
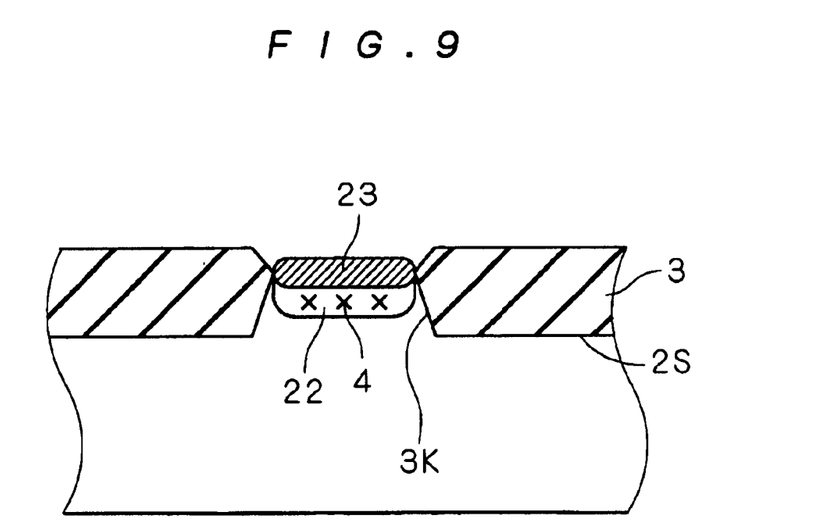

Next, as show in FIG. 8, a metal film 23A of e.g., titanium is so formed as to cover the impurity region 22. Subsequently, the metal film 23A and the impurity region 22 are silicified (or alloyed) to form a silicide film. Further, the silicification is generally performed at lower temperature than e.g., a heat treatment for activating the dopant. After that, an unsilicified portion of the metal film 23A is removed, to obtain the silicide film 23 as shown in FIG. 9. During the silicification, the crystal defects 4 are produced in the impurity region 22, more specifically, in the region near the silicide film 23 in the substrate surface 2S inside the opening 3K.

After that, an oxide film for the gate insulating film 92 of the MOSFET 90 (see FIG. 1) is formed.

Figure 10:
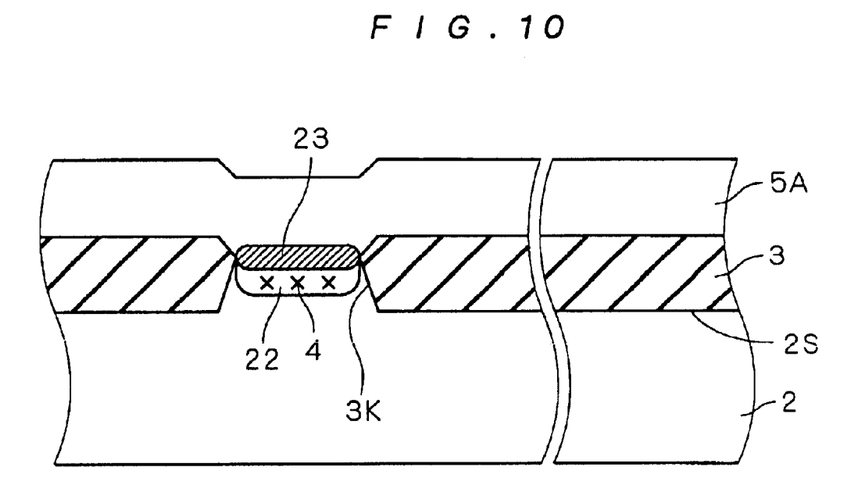

Next, a not-doped (intrinsic) polycrystalline silicon film 5A is deposited by LPCVD (Low Pressure Chemical Vapor Deposition) to have a thickness of 50 nm to 250 nm, as shown in FIG. 10. At this time, the polycrystalline silicon film 5A is so formed entirely on the substrate surface 2S as to cover the isolation insulating film 3 and the oxide film for the gate insulating film 92. Then, the polycrystalline silicon film 5A is patterned by photolithography, to form the polycrystalline silicon films 50, 60, 70 and 80, the polycrystalline silicon film for the resistive element 5P and a polycrystalline silicon film for the gate electrode 95 (which becomes the polycrystalline silicon film 93 later) (see FIG. 1).

After that, the second regions 52 and 62 of the resistive elements 5 and 6 and the silicide film 73 with respect to the resistive element 7 are formed.

Figure 11:
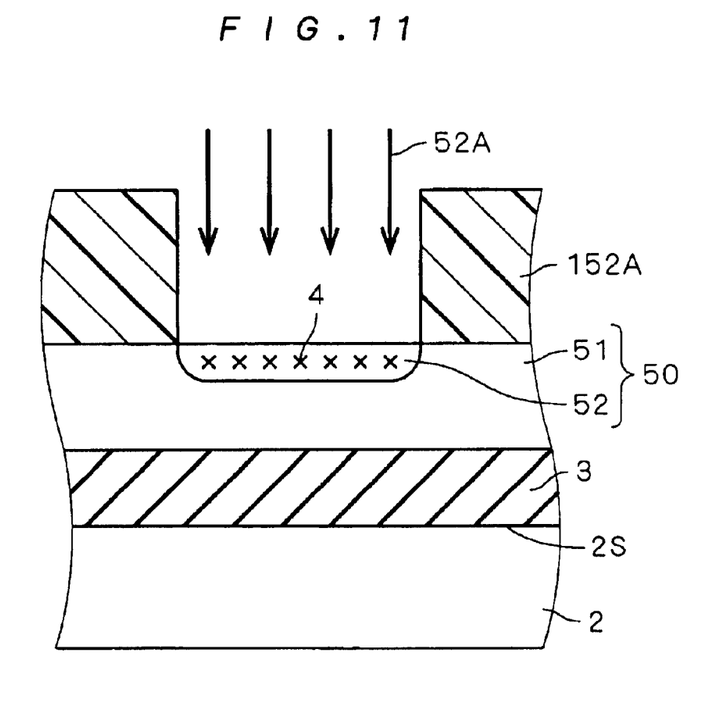

In more detail, the second region 52 of the resistive element 5 is formed in the following manner. As shown in FIG. 11, a resist 152A is formed on the polycrystalline silicon film 50 with a portion for forming the second region 52 is opened. Then, with the resist 152A used as a mask, e.g., arsenic (or crystal defect inducing particles) 52A is ion-implanted into the polycrystalline silicon film 50. The arsenic 52A is ion-implanted at an accelerating energy of 20 keV or more at a dose of $3 \times 10^{15}/cm^2$ or more. This ion implantation causes the crystal defects 4 in the second region 52 (increases the density of crystal defects).

In this case, the ion implantation process for the second region 52 of the resistive element 5 and that for the source/drain regions 91 of the MOSFET 90 are performed at the same time. Further, in the ion implantation process for the source/drain regions 91, that for the polycrystalline silicon film 93 of the gate electrode 95 may be performed at the same time.

Figure 12:
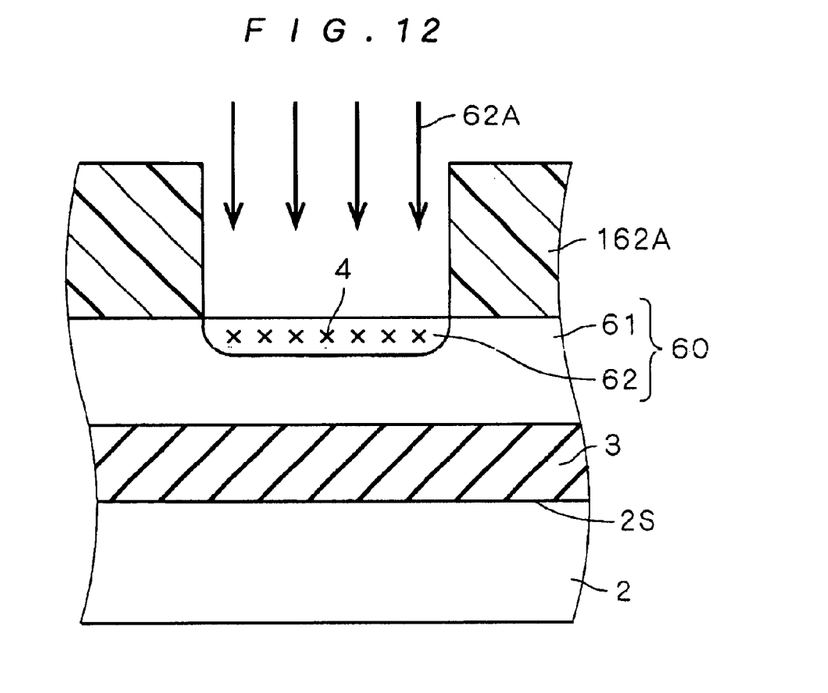

The second region 62 of the resistive element 6 is formed in the following manner. As shown in FIG. 12, a resist 162A is formed on the polycrystalline silicon film 60 with a portion for forming the second region 62 is opened. Then, with the resist 162A used as a mask, e.g., nitrogen (or crystal defect inducing particles) 62A is ion-implanted into the polycrystalline silicon film 60. The nitrogen 62A is ion-implanted at an accelerating energy of 4 keV or more at a dose of $2 \times 10^{15}/cm^2$ or more. This ion implantation causes the crystal defects 4 in the second region 62 (increases the density of crystal defects).

Further, instead of the nitrogen 62A, e.g., fluorine may be implanted at an accelerating energy of 5 keV or more, or argon may be implanted at an accelerating energy of 2 keV or more. Furthermore, a plurality of kinds of ions may be implanted. In this case, as the atomic weight (magnitude of the atom) of the ion becomes larger, more crystal defects 4 can be produced at the same dose.

Figure 13:
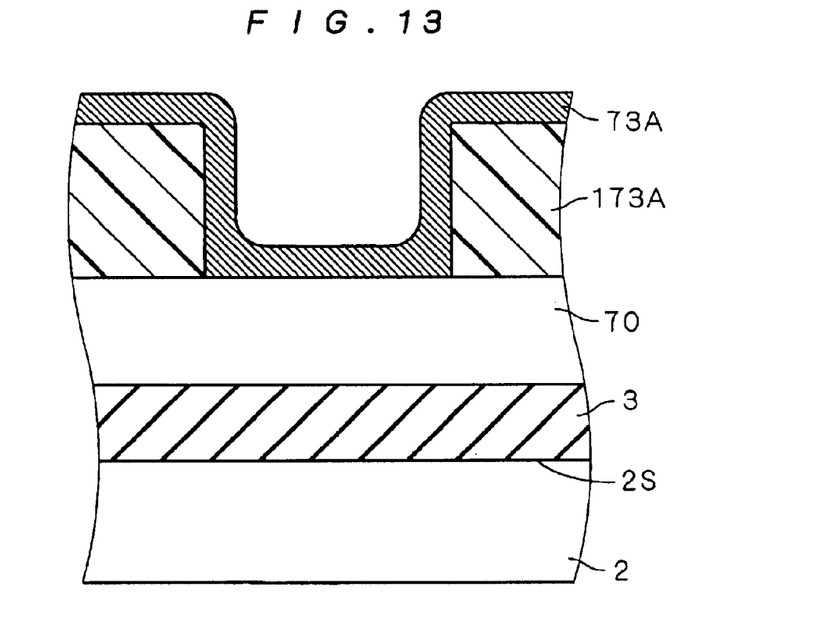

The silicide film 73 with respect to the resistive element 7 is formed in the following manner. As shown in FIG. 13, a resist 173A is formed on the polycrystalline silicon film 70 with a portion for forming the silicide film 73 is opened. Then, a metal film 73A such as titanium, cobalt, nickel or tungsten is so formed as to cover a portion of the polycrystalline silicon film 70 which is exposed in the opening of the resist 173A. Subsequently, the metal film 73A and the polycrystalline silicon film 70 are silicified (or alloyed) to form a silicide film. After that, an unsilicified portion of the metal film 73A is removed, to obtain the silicide film 73 as shown in FIG. 4. During the silicification, the crystal defects 4 are produced in the second region 72 of the polycrystalline silicon film 70 (the density of crystal defects increases). In this case, a process for forming the silicide film 73 and that for forming the silicide film 94 of the MOSFET 90 may be performed at the same time.

After obtaining the semiconductor device 1 shown in FIG. 1, a protection film and metal wires are formed in a general process.

Since the crystal defects 4 in the second regions 52, 62 and 72 and the impurity region 22 getter the metal atoms 11P (see FIG. 16) causing the leak current 12P or the metal atoms which may become the metal atoms 11P, the semiconductor device 1 can reduces the leak current below the isolation insulating film 3. Further, by the above manufacturing method, such a semiconductor device 1 can be manufactured.

In this case, by setting the density of crystal defects 4 in the second regions 52, 62 and 72 and the impurity region 22 to $10^{15}/cm^3$ order or more, the gettering effect is more reliably achieved.

Further, it is preferable that the interval of a plurality of second regions 52 in the polycrystalline silicon film 50 should be set shorter than the length of diffusion of the metal atoms 11P (see FIG. 16) causing the leak current 12P (set to e.g., 10 µm or less according to the inventors' experiment). Such a setting of interval allows more reliable gettering of the metal atoms 11P. This setting of interval can be applied to the second regions 62 and 72 of the polycrystalline silicon films 60 and 70 and the impurity region 22 in the substrate 2.

Further, the above setting of interval can be applied to adjacent ones of the resistive elements 5 to 8. For example, it is preferable that the interval between the second region 52 of the resistive element 5 and the second region 62 of the resistive element 6 should be set to 10 µm or less. Furthermore, when the interval between the second region 52 of the resistive element 5 and the second region 72 of the resistive element 7 is set to 10 µm or less, the second region 62 may not be provided between the second regions 52 and 72. In other words, it is not necessary to arrange the second regions 52, 62 and 72 and the impurity region 22 (see FIG. 5) in the direction of arrangement of the resistive elements 5 to 8 (transversal direction in FIG. 1) like in FIG. 1.

Since the low-resistive second region 52 of the resistive element 5, for example, is formed only partially in the polycrystalline silicon film 50, the resistive element 5 can provide the same resistance value as the background-art resistive element 5P of the same shape.

There may be a case where combination of the second regions 52, 62 and 72 and the impurity region 22 is used. For example, by ion-implanting nitrogen or the like into e.g., the second region 52, the second regions 52 and 62 can be combined. Alternatively, for example, the silicide film 73 may be formed on the second region 52 or 62. Further, since the silicification is generally performed at lower temperature than the heat treatment for activating the dopant, as discussed above, it is possible to produce the crystal defects 4 caused by both the second region 52 or 62 and the silicide film 73. Alternatively, for example, the second region 52 or 62 or the silicide film 73 may be provided for the polycrystalline silicon film 80 forming the resistive element 8.

Though the above discussion has been made on the case where a plurality of kinds of resistive elements 5 to 8 are formed on one isolation insulating film 3, one kind of resistive element 5, 6, 7 or 8 may be formed on one isolation insulating film 3.

Further, there may be a case where a plurality of resistive elements 5, 6, 7 and 8 are combined to form one resistive element. For example, both the second region 52 and the silicide film 73 may be separately provided for one polycrystalline silicon film.

Furthermore, instead of the polycrystalline silicon films 50, 60, 70 and 80, amorphous silicon or other semiconductor materials may be used. The polycrystalline silicon films 50, 60, 70 and 80 may also be formed by heat treatment of amorphous silicon.

Designed according to a general scaling rule, the semiconductor device 1 can respond to development in microtechnology in the future.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   a semiconductor substrate having a substrate surface;
   an insulating film arranged on said substrate surface; and
   a resistive element formed of a semiconductor film, opposed to said substrate surface with said insulating film interposed therebetween and arranged in contact with said insulating film, wherein
   said resistive element includes a first region and a second region whose density of crystal defects is higher than that of said first region, said first region and said second region being laterally arranged in a plan view; and
   the semiconductor device further comprises a compound film made of a compound of the material of said semiconductor film and a metal, being arranged in contact with only said second region of said resistive element.

2. The semiconductor device according to claim 1, wherein
   said second region of said resistive element includes crystal defect factors which induce said crystal defects.

3. The semiconductor device according to claim 2, wherein
   said crystal defect factors include at least one selected from the group consisting of an element serving as a dopant, an elemental semiconductor, nitrogen, fluorine and argon.

4. The semiconductor device according to claim 1, wherein
   said semiconductor film includes either a polycrystalline semiconductor film or an amorphous semiconductor film.

5. A semiconductor device comprising:

a semiconductor substrate having a substrate surface;

an insulating film having an opening, being arranged on said substrate surface;

a resistive element formed of a semiconductor film, being opposed to said substrate surface with said insulating film interposed therebetween; and a compound film made of a compound of the material of said semiconductor substrate and a metal, being arranged in said opening in contact with only said substrate surface, said insulating film, and said resistive element.

6. The semiconductor device according to claim 5, further comprising:

an impurity region formed in said substrate surface in said opening, having a conductivity type opposite to that of said semiconductor substrate.

7. The semiconductor device according to claim 5, wherein said semiconductor film includes either a polycrystalline semiconductor film or an amorphous semiconductor film.

8. The semiconductor device according to claim 2, wherein the crystal defect factors comprise implanted ions.

9. The semiconductor device according to claim 5, wherein the resistive element is arranged in direct contact with the compound film.

10. The semiconductor device according to claim 5, wherein the resistive element is a semiconductor.

11. The semiconductor device according to claim 5, wherein the resistive element comprises polycrystalline silicon.

* * * * *